(12) United States Patent
Zheng et al.

(10) Patent No.: US 7,434,115 B2
(45) Date of Patent: Oct. 7, 2008

(54) ENCODING AND DECODING APPARATUS AND METHOD

(75) Inventors: Yan-Xiu Zheng, Taipei County (TW); Yu T. Su, Hsinchu (TW)

(73) Assignee: Industrial Technology Research Institute, Taiwan (CH)

( * ) Notice: Subject to any disclaimer, the term of this patent is extended or adjusted under 35 U.S.C. 154(b) by 263 days.

(21) Appl. No.: 10/960,046

(22) Filed: Oct. 8, 2004

(65) Prior Publication Data
US 2005/0071728 A1   Mar. 31, 2005

(51) Int. Cl.
*G06F 11/00* (2006.01)
*H03M 13/03* (2006.01)

(52) U.S. Cl. ............... 714/701; 714/702; 714/787; 714/788

(58) Field of Classification Search ............... 714/701, 714/702, 787, 788
See application file for complete search history.

(56) References Cited

U.S. PATENT DOCUMENTS

| | | | | |
|---|---|---|---|---|
| 5,446,747 A | * | 8/1995 | Berrou | 714/788 |
| 5,721,745 A | * | 2/1998 | Hladik et al. | 714/755 |
| 5,970,085 A | * | 10/1999 | Yi | 370/342 |
| 5,978,365 A | * | 11/1999 | Yi | 370/331 |
| 5,996,104 A | | 11/1999 | Herzberg | |
| 6,023,783 A | * | 2/2000 | Divsalar et al. | 714/792 |
| 6,161,209 A | * | 12/2000 | Moher | 714/780 |
| 6,304,995 B1 | * | 10/2001 | Smith et al. | 714/786 |
| 6,392,572 B1 | | 5/2002 | Shiu et al. | |
| 6,553,516 B1 | * | 4/2003 | Suda et al. | 714/702 |
| 6,598,202 B1 | * | 7/2003 | Kim et al. | 714/786 |
| 6,654,927 B1 | * | 11/2003 | Sall et al. | 714/786 |
| 6,757,865 B1 | * | 6/2004 | Nakamura et al. | 714/796 |

OTHER PUBLICATIONS

"Near Shannon Limit Error-Correcting Coding and Decoding Turbo Codes," C. Berrou, A. Glavieux and P. Thitimajshima, Proc. of IEEE Inter. Conf. on Comm., pp. 1064-1070, 1993.

* cited by examiner

*Primary Examiner*—Joseph D. Torres
(74) *Attorney, Agent, or Firm*—Alston & Bird LLP

(57) ABSTRACT

An interleaver and method of interleaving operate on data represented in a sequence of symbols to produce an interleaved sequence of symbols. The interleaver performs intra-block and inter-block permutations on the sequence of symbols. An encoder and method of encoding operate on data represented in a source sequence of symbols. The source sequence of symbols is encoded into a first sequence of codewords and interleaved using intra-block and inter-block permutations to produce a sequence of interleaved symbols. The sequence of interleaved symbols is encoded into a second sequence of codewords. A decoder and method of decoding operate on data represented in a sequence of received symbols. The sequence of received symbols comprises a formatted copy of the source sequence of symbols and the first and the second sequence of codewords.

16 Claims, 11 Drawing Sheets

ENCODING AND DECODING APPARATUS AND METHOD

The present patent claims benefit of U.S. provisional patent application 60/314,673, titled Interleaver Design and Associated Encoding and Decoding-Structures for Turbo Codes, filed on Aug. 27, 2001, by Yan-Xiu Zheng, Yu T. Su, and Wei-Ting Wang, the contents of which are incorporated herein by reference.

DESCRIPTION OF THE INVENTION

1. Field of the Invention

The present invention relates to encoding and decoding apparatus and method and, more particularly, to such apparatus and method including interleaving for improved performance.

2. Background of the Invention

Methods for reducing error rates in data transmission may involve using encoding algorithms to encode data with error correcting codes. At a receiving end, the encoded data is decoded by decoding algorithms to reproduce the originally transmitted data with low occurrences of error. However, highly effective error correcting codes usually require complex decoding algorithms and such complex decoding algorithms can be difficult to implement.

Turbo codes provide a compromise between error correction and decoder complexity. Turbo codes employ concatenated coding in which two or more constituent codes are used sequentially or in parallel, usually with some form of an interleaver structure in between. The first constituent code has codewords used for checking and correcting of the data being encoded. The second constituent code has codewords used for checking and correcting of the data being encoded after interleaving. Individually the constituent codes are of limited effectiveness in error correction, but depending on the interleaver structure, the combination of the two constituent codes is surprisingly effective, if a proper decoding algorithm is used.

The interleaver permutes the data being encoded to ensure that data being encoded for which one constituent code has low-weight codewords causes the other constituent code to have high-weight codewords. The weight of a codeword is defined as the number of nonzero coordinates in the codeword. How well interleaving succeeds in ensuring high-weight codewords depends on the depth of interleaving and the interleaver structure. Interleaver depth is defined to be the maximum difference in position that a symbol in the data being encoded has before and after interleaving. The greater the interleaver depth, the greater likelihood that the codewords of the two constituent codes favorably complement each other to create highly effective error correction for the data being encoded.

At the receiving end, the two constituent codes are decoded with respective decoders to produce estimates of the data before encoding. Each decoder decodes its respective constituent code and sends a posteriori data estimates, estimates based only on received encoded data, to the other decoder. Each decoder then uses the a posteriori estimates from the other decoder as a priori information to produce a priori estimates, estimates based on prior information known about the encoded data. A priori estimates from each decoder are sent to the other decoder to produce new a priori estimates. This last step is iterated several times to yield progressively better a priori estimates until satisfactory convergence is reached. The generation of an a priori or a posteriori estimate is referred to as a decoding iteration.

In spite of their powerful error correcting capability, turbo codes are generally viewed as more suitable for applications that do not have stringent delay requirements. However, it may be desirable to reduce delays associated with decoding in turbo codes to take advantage of their relatively simple implementation and error correction strengths in certain applications.

SUMMARY OF THE INVENTION

Methods, devices, systems, and articles of manufacture consistent with the present invention enable parallel encoding and decoding in turbo codes for shorter decoding delays and increased design flexibility for various applications.

One exemplary aspect consistent with features and principles of the present invention is an encoder that operates on data represented in a source sequence of symbols. The encoder comprises primary encoding means for encoding the source sequence of symbols into a first sequence of codewords, interleaving means for performing intra-block and inter-block permutations on the source sequence of symbols to produce a sequence of interleaved symbols, and secondary encoding means for encoding the sequence of interleaved symbols into a second sequence of codewords.

A second exemplary aspect consistent with features and principles of the present invention is a decoder that operates on data represented in a sequence of received symbols. The sequence of received symbols comprises a source sequence of symbols and a first and a second sequence of codewords. The decoder comprises primary decoding means for decoding the first sequence of codewords in combination with the source sequence of symbols to produce a sequence of primary decoded symbols, interleaving means for performing intra-block and inter-block permutations on the source sequence of symbols and the sequence of primary decoded symbols to produce a sequence of interleaved symbols and a sequence of intermediate symbols, respectively, secondary decoding means for decoding the second sequence of codewords in combination with the sequence of interleaved symbols and the sequence of intermediate symbols to produce a sequence of secondary decoded symbols, and de-interleaving means for performing inter-block and intra-block permutations on the sequence of secondary decoded symbols to produce a sequence of estimated symbols.

A third exemplary aspect consistent with features and principles of the present invention is a system that operates on data represented in a source sequence of symbols. The system comprises primary encoding means for encoding the source sequence of symbols into a first sequence of codewords, first interleaving means for performing intra-block and inter-block permutations on the source sequence of symbols to produce a sequence of interleaved symbols, secondary encoding means for encoding the sequence of interleaved symbols into a second sequence of codewords, output means for combining and sending the source sequence of symbols, the first sequence of codewords, and the second sequence of codewords to a medium as a sequence of received symbols, receiving means for receiving the sequence of received symbols from the medium, primary decoding means for decoding the first sequence of codewords in combination with the source sequence of symbols to produce a sequence of primary decoded symbols, second interleaving means for performing intra-block and inter-block permutations on the source sequence of symbols and the sequence of primary decoded symbols to produce a sequence of decoder interleaved symbols and a sequence of intermediate symbols, respectively, secondary decoding means for decoding the second sequence of codewords in combination with the sequence of decoder interleaved symbols and the sequence of intermediate symbols to produce a sequence of secondary decoded symbols, and de-interleaving means for performing inter-block and intra-block permutations on the sequence of secondary decoded symbols to produce a sequence of estimated symbols.

A fourth exemplary aspect consistent with features and principles of the present invention is a system that operates on data represented in a source sequence of symbols. The system comprises primary encoding means for encoding the source sequence of symbols into a first sequence of codewords, first interleaving means for interleaving the source sequence of symbols using intra-block and inter-block permutations to produce a sequence of interleaved symbols, secondary encoding means for encoding the sequence of interleaved symbols into a second sequence of codewords, output means for combining and sending the source sequence of symbols, the first sequence of codewords, and the second sequence of codewords to a medium as the sequence of received symbols, receiving means for receiving the sequence of received symbols from the medium, plurality of primary decoding means for decoding the first sequence of codewords in combination with the source sequence of symbols to produce a plurality of sequences of primary decoded symbols, second interleaving means for interleaving the source sequence of symbols using intra-block and inter-block permutations to produce a sequence of decoder interleaved symbols, plurality of intermediate interleaving means for interleaving the plurality of sequences of primary decoded symbols using intra-block and inter-block permutations to produce a plurality of respective sequences of intermediate symbols, plurality of secondary decoding means for decoding the second sequence of codewords in combination with the sequence of decoder interleaved symbols to produce a plurality of sequences of secondary decoded symbols, and plurality of de-interleaving means for de-interleaving the plurality of sequences of the secondary decoded symbols to produce a plurality of respective sequences of estimated symbols. An $I^{th}$ one of the plurality of secondary decoding means for decoding the second sequence of codewords uses an $I^{th}$ one of the plurality of sequences of intermediate symbols. An $(I+1)^{th}$ one of the plurality of primary decoding means for decoding the first sequence of codewords uses an $I^{th}$ one of the plurality of the sequences of estimated symbols.

A fifth exemplary aspect consistent with features and principles of the present invention is a method for encoding data represented in a source sequence of symbols. The method comprises encoding the source sequence of symbols into a first sequence of codewords, interleaving the source sequence of symbols using intra-block and inter-block permutations to produce a sequence of interleaved symbols, and encoding the sequence of interleaved symbols into a second sequence of codewords.

A sixth exemplary aspect consistent with features and principles of the present invention is a method for decoding data represented in a sequence of received symbols. The sequence of received symbols comprises a source sequence of symbols to be estimated and a first and a second sequence of codewords to be decoded. The method comprises decoding the first sequence of codewords in combination with the source sequence of symbols to produce a sequence of primary decoded symbols, interleaving the source sequence of symbols and the sequence of primary decoded symbols using intra-block and inter-block permutations to produce a sequence of interleaved symbols and a sequence of intermediate symbols, respectively, decoding the second sequence of codewords in combination with the sequence of interleaved symbols and the sequence of intermediate symbols to produce a sequence of secondary decoded symbols, and de-interleaving the sequence of secondary decoded symbols using inter-block and intra-block permutations to produce a sequence of estimated symbols.

A seventh exemplary aspect consistent with features and principles of the present invention is a method for operating on data represented in a source sequence of symbols. The method comprises encoding the source sequence of symbols into a first sequence of codewords, interleaving the source sequence of symbols using intra-block and inter-block permutations to produce a sequence of interleaved symbols, encoding the sequence of interleaved symbols into a second sequence of codewords, combining and sending the source sequence of symbols, the first sequence of codewords, and the second sequence of codewords to a medium as the sequence of received symbols, receiving the sequence of received symbols from the medium, decoding the first sequence of codewords in combination with the source sequence of symbols to produce a sequence of primary decoded symbols, interleaving the source sequence of symbols and the sequence of primary decoded symbols using intra-block and inter-block permutations to produce a sequence of decoder interleaved symbols and a sequence of intermediate symbols, respectively, decoding the second sequence of codewords in combination with the sequence of decoder interleaved symbols and the sequence of intermediate symbols to produce a sequence of secondary decoded symbols, and de-interleaving the sequence of secondary decoded symbols using inter-block and intra-block permutations to produce a sequence of estimated symbols.

An eighth exemplary aspect consistent with features and principles of the present invention is a method for operating on data represented in a source sequence of symbols. The method comprises encoding the source sequence of symbols into a first sequence of codewords, interleaving the source sequence of symbols using intra-block and inter-block permutations to produce a sequence of interleaved symbols, encoding the sequence of interleaved symbols into a second sequence of codewords, combining and sending the source sequence of symbols, the first sequence of codewords, and the second sequence of codewords to a medium as the sequence of received symbols, receiving the sequence of received symbols from the medium, decoding the first sequence of codewords in combination with the source sequence of symbols to produce a plurality of sequences of primary decoded symbols, interleaving the source sequence of symbols using intra-block and inter-block permutations to produce a sequence of decoder interleaved symbols, interleaving the plurality of sequences of primary decoded symbols using intra-block and inter-block permutations to produce a plurality of respective sequences of intermediate symbols, decoding the second sequence of codewords in combination with the sequence of decoder interleaved symbols to produce a plurality of sequences of secondary decoded symbols, and de-interleaving the plurality of sequences of secondary decoded symbols to produce a plurality of respective sequences of estimated symbols. An $I^{th}$ one of the plurality of sequences of intermediate symbols is used in decoding the second sequence of codewords in combination with the sequence of decoder interleaved symbols to produce an $I^{th}$ one of the plurality of sequences of secondary decoded symbols. An $I^{th}$ one of the plurality of sequences of estimated symbols is used in decoding the first sequence of codewords in combination with the source sequence of symbols to produce an $(I+1)^{th}$ one of the plurality of sequences of primary decoded symbols.

Additional aspects of the invention are set forth in the description which follow, and in part are obvious from the description, or may be learned by practice of methods, devices, systems, and articles of manufacturer consistent with features of the present invention. The aspects of the invention are realized and attained by means of the elements and combinations particularly pointed out in the appended claims. It is understood that both the foregoing description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several aspects of the invention and, together with the description, serve to explain the principles of the invention. In the drawings.

DESCRIPTION OF EMBODIMENTS

Reference is now made in detail to the exemplary embodiments of the invention, examples of which are illustrated in the accompanying drawings. Wherever possible, the same reference numbers are used throughout the drawings to refer to the same or like parts.

One approach to reduce delays associated with decoding in turbo codes is to find a way to start a decoding iteration before the previous iteration ends. This would allow parallel decoding. However, conventional interleavers used in turbo codes do not render themselves suitable for parallel decoding. Features and principles consistent with the present invention illustrate, among other things, an interleaving design that allows parallel decoding.

Figure 1:
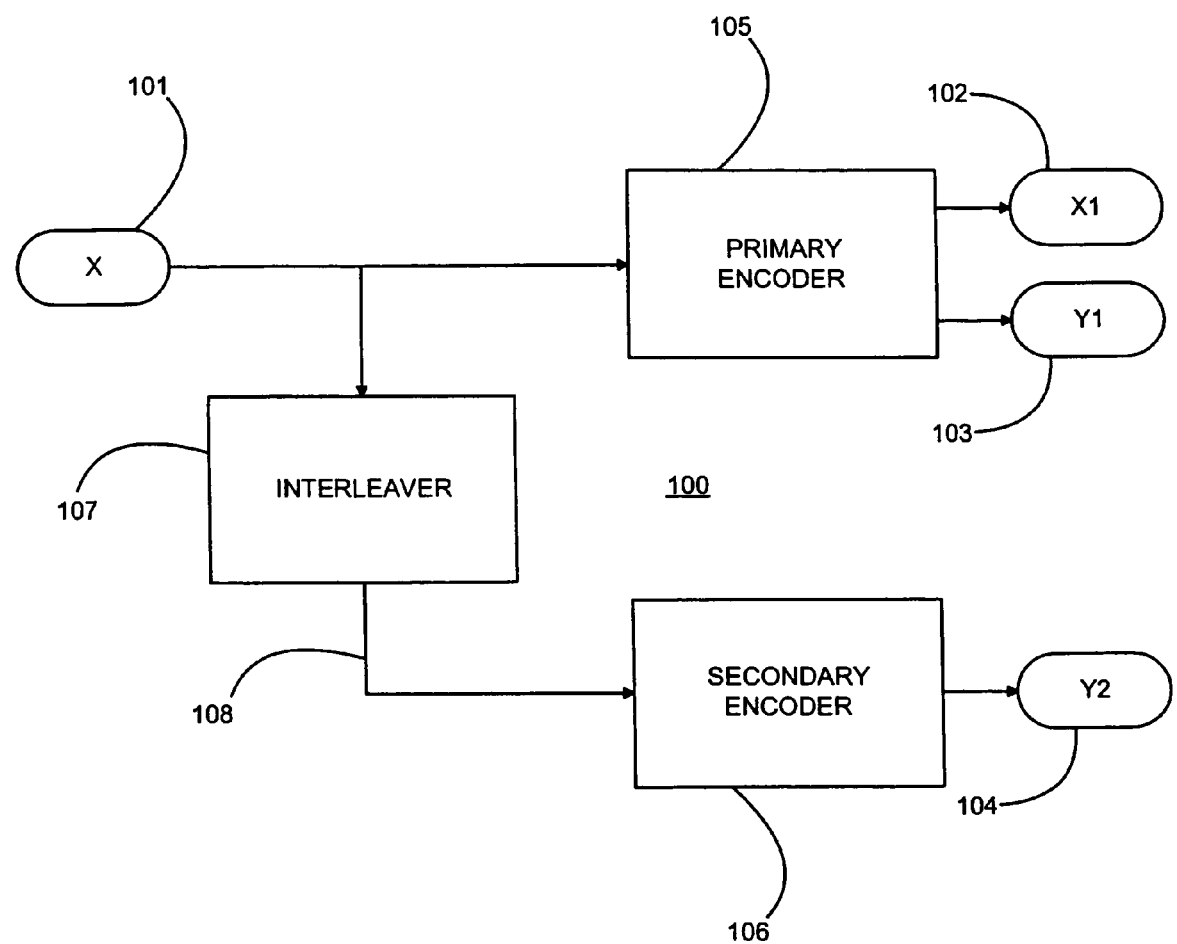
FIG. 1 illustrates an exemplary encoder in which methods, devices, systems, and articles of manufacturer, consistent with features and principles of the present invention may be implemented.

FIG. 1 illustrates an exemplary encoder 100 in which features and principles consistent with the present invention may be implemented. Encoder 100 includes input data represented as a source sequence of symbols X 101 to be encoded, a formatted copy X1 102 of the source sequence of symbols, a first sequence of codewords Y1 103, a second sequence of codewords Y2 104, a primary encoder 105, a secondary encoder 106, an interleaver 107, and a sequence of interleaved symbols 108. The primary encoder 105 encodes the source sequence of symbols X 101 into the first sequence of codewords Y1 103 using a predetermined encoding algorithm. The encoding algorithm may be any algorithm known in the art and compatible with the operation of the present invention. Exemplary encoding algorithms may include convolutional codes such as described on pages 469-508 by Carson in *Communication Systems. An Introduction to Signals and Noise in Electrical Communication.* 3$^{rd}$ Ed., McGraw-Hill Book Company, New York, 1986.

The primary encoder 105 also copies and formats the source sequence of symbols X 101 to produce the formatted copy X1 102 of the source sequence of symbols. The interleaver 107 permutes the source sequence of symbols X 101 into the sequence of interleaved symbols 108. The secondary encoder 106 encodes the sequence of interleaved symbols 108 into the second sequence of codewords Y2 104. The formatted copy X1 102 of the source sequence of symbols, the first sequence of codewords Y1 103, and the second sequence of codewords Y2 104 are transmitted over a medium (not shown). Exemplary methods for combining and transmitting may include systematic block codes as described in Carson, cited above. The medium may be anything capable of conveying or storing information and includes communication channels, ambient space, and storage devices. Exemplary storage devices include magnetic media, random access memory, and printed materials.

Figure 2A:
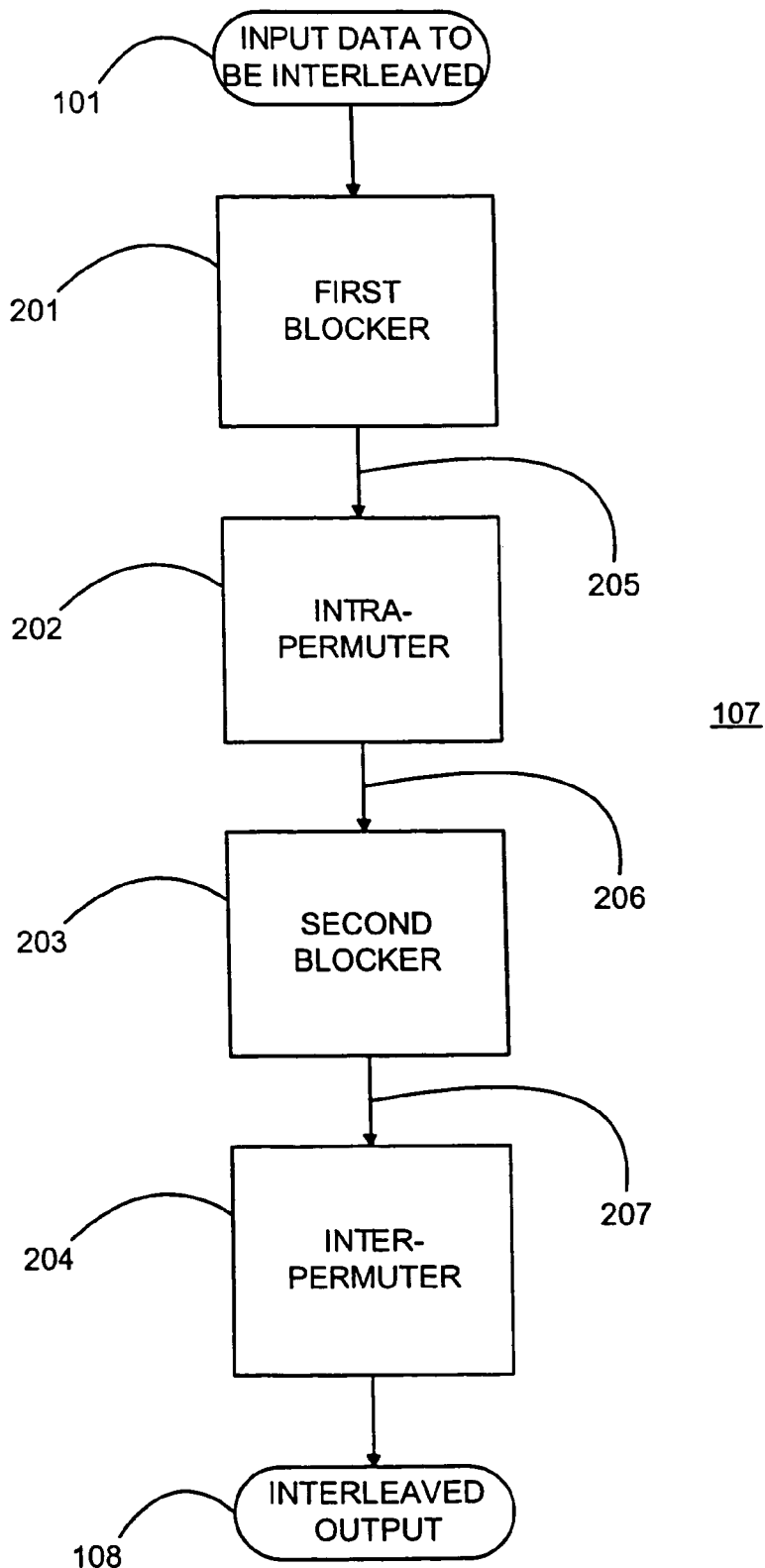
FIG. 2A illustrates an exemplary construction of an interleaver consistent with features and principles of the present invention.

FIG. 2A illustrates an exemplary construction of the interleaver 107 in the encoder 100 consistent with features and principles of the present invention. The interleaver 107 includes a first blocker 201, an intra-pemmter 202, a second blocker 203, and an inter-permuter 204. The interleaver 107 permutes the order of symbols in the source sequence of symbols X 101 into a sequence of interleaved symbols 108. In its operation, the interleaver 107 produces a sequence of blocks 205, a sequence of intra-permuted symbols 206, and a sequence of intra-permuted blocks 207. The source sequence of symbols X 101 is partitioned into the sequence of blocks 205 by the first blocker 201. The intra-permuter 202 re-orders the symbols within each block of the sequence of blocks 205 to form the sequence of intra-permuted symbols 206. The sequence of intra-permuted symbols 206 is partitioned into the sequence of blocks 207 by the second blocker 203. The inter-permuter 204 re-orders the symbols across the blocks in the sequence of intra-permuted blocks 207 to form the interleaved output sequence of symbols 108.

Figure 2B:
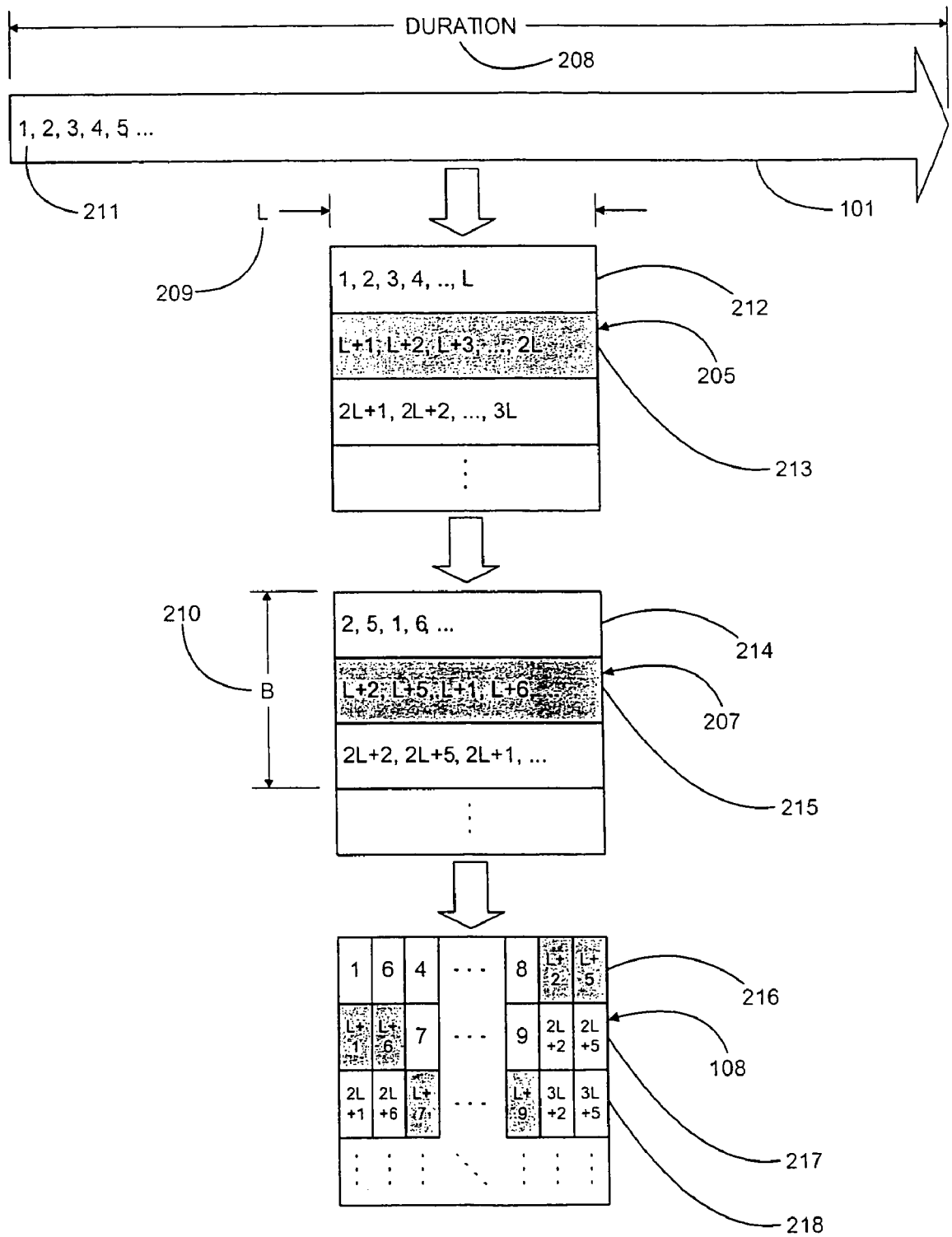
FIG. 2B illustrates results at different temporal stages of the exemplary interleaver consistent with features and principles of the present invention.

FIG. 2B illustrates results at different temporal stages in the exemplary interleaver 107 consistent with features and principles of the present invention. The symbols in the source sequence of symbols X 101 are labeled with numeric indices 211 starting from number one. The source sequence of symbols X 101 is partitioned by the first blocker 201 into the sequences of blocks 205. The blocks in the source sequence of blocks 205 are represented as shaded symbols with indices 211, wherein symbols having the same shade are in the same block. All the blocks in the sequence 205 are of an equal length L 209 in symbols. For example, a first block 212 in the sequence of blocks 205 contains the symbols in the source sequence X 101 with indices 211, in order, from one to L. A second block 213 in the sequence of blocks 205 contains the symbols in the source sequence X 101 with indices 211, in order, from L+1 to 2L. Subsequent blocks in the sequence of blocks 205 contain L symbols in the source sequence X 101, wherein the $I^{th}$ block in the sequence of blocks 205 contains the symbols in the source sequence 205 with indices 211, in order, from ((I−1)*L)+1 to I*L. More particularly, if L is equal to ten, then the first block 212 in the sequence of blocks 205 contains the symbols in the source sequence X 101 with indices 211, in order, from one to ten. The second block 213 in the sequence of blocks 205 contains the symbols with indices 211, in order, from eleven to twenty. The $I^{th}$ block in the sequence of blocks 205 contains ten symbols in the source sequence X 101 with indices 211, in order, from ((I−1)*10)+1 to I*10.

The symbols within each block of the sequence of blocks 205 are re-ordered by the intra-permuter 202 to form the sequence of intra-permuted symbols 206. The sequence of intra-permuted symbols 206 is partitioned into the sequence of intra-permuted blocks 207 by the second blocker 203. The intra-permuted blocks in the sequence of intra-permuted blocks 207 may or may not have the same length in symbols as the blocks in the sequence of blocks 205, but for illustration, it is assumed that the lengths are equal, namely of length L 209. The first intra-permuted block 214 in the sequence of intra-permuted blocks 207 contains the symbols from the source sequence X 101 with indices 211, in a following order, two, five, one, six, and so forth to the $L^{th}$ symbol in the first intra-permuted block 214. The second intra-permuted block 215 in the sequence of intra-permuted blocks 207 contains symbols from the source sequence X 101 with indices 211, in a following order, L+2, L+5, L+1, L+6, and so forth to the $L^{th}$ symbol in the second intra-permuted block 215. Subsequent intra-permuted blocks in the sequence of intra-permuted blocks 207 contain L symbols from the source sequence X 101, wherein the $J^{th}$ intra-permuted block in the sequence of intra-permuted blocks 207 contains symbols from the source sequence X 101 with indices 211, in a following order, ((J−1)*L)+2, ((J−1)*L)+5, ((J−1)*L)+1, ((J−1)*L)+6, and so forth to the $L^{th}$ symbol in the $J^{th}$ intra-permuted block.

The symbols in the intra-permuted blocks of the sequence of intra-permuted blocks 207 are re-ordered across a number of blocks B 210 by the inter-permuter 204 to form the interleaved output sequence of symbols 108. For example, if the number of blocks B 210 to re-order across is equal to three, then the first L symbols 216 in the interleaved output sequence 108 contain portions of the first and second intra-permuted blocks 214 & 215 in the sequence of intra-permuted blocks 207. The next L symbols 217 in the interleaved output sequence 108 contain portions of the first to the third intra-permuted blocks in the sequence of intra-permuted blocks 207. The following L symbols 218 in the interleaved output sequence 108 contain portions of the second to the fourth intra-permuted blocks in the sequence of intra-permuted blocks 207.

The interleaver 107 allows encoding and decoding procedures to be devised to handle a source sequence of symbols X 101 of finite or infinite duration 208 while introducing a minimum decoding delay. The maximum interleaver depth of the interleaver 107 can also be set by selecting the length L 209 in symbols of the blocks in the sequence of intra-permuted blocks 207 and the number of blocks B 210 to re-order symbols across during inter-block permutation by the inter-permuter 204. The maximum interleaver depth is then the length L 209 multiplied by the number of blocks B 210.

Figure 2C:
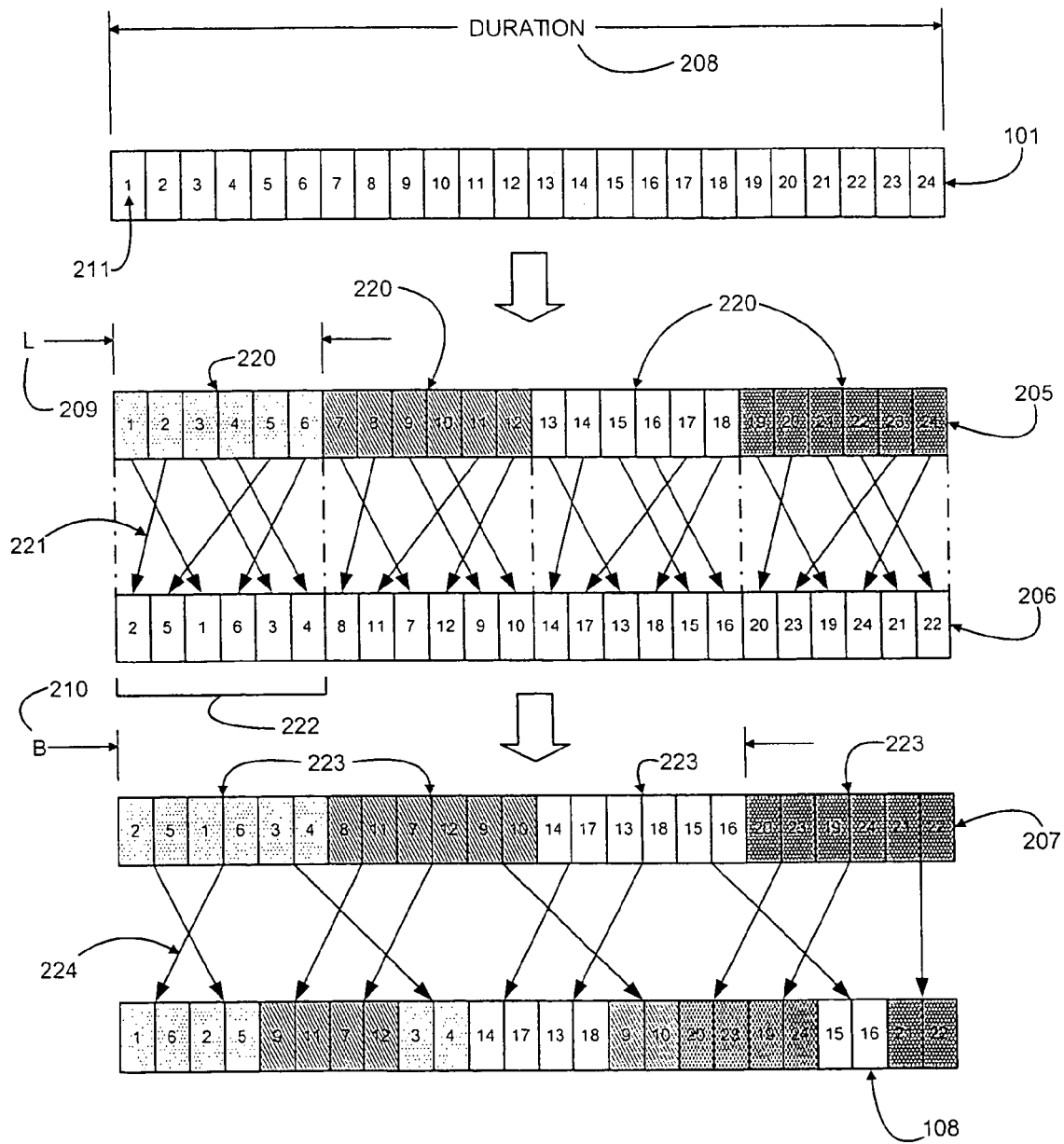
FIG. 2C further illustrates results at different temporal stages of the exemplary interleaver consistent with features and principles of the present invention.

FIG. 2C further illustrates results at different temporal stages of the exemplary interleaver consistent with features and principles of the present invention. In the example illustrated in FIG. 2C, the duration 208 of the source sequence of symbols X 101 is of finite length and consists of twenty-four symbols, the length L 209 of each block in the sequence of blocks 205 and the sequence of intra-permuted blocks 207 is six, and the number of blocks B 210 to inter-permute across is three. The symbols in the source sequence of symbols X 101 are labeled with indices 211 from one to twenty-four. The source sequence of symbols X 101 is partitioned into the sequence of blocks 205 with four blocks 220 of six symbols each. The blocks in the sequence of blocks 205 are represented as shaded symbols with indices 211, wherein symbols having the same shading are in the same block. The symbols within the sequence of blocks 205 are intra-permuted within each block to produce the sequence of intra-permuted symbols 206. The intra-permutation re-orders the symbols within each block in the manner indicated by arrows 221. For example, the symbols in the first block of the sequence of blocks 205 with indices one, two, three, four, five, and six are re-ordered to two, five, one, six, three, and four in the first six intra-permuted symbols 222 of the sequence of intra-permuted symbols 206. The intra-permuted symbols in the sequence 206 are grouped into the sequence of intra-permuted blocks 207 with four intra-permuted blocks 223 of six symbols each. The intra-permuted blocks in the sequence of intra-permuted blocks 207 are represented as shaded symbols with indices 211, wherein symbols having the same shading are in the same intra-permuted block. The sequence of intra-permuted blocks 207 are inter-permuted to the sequence of interleaved symbols 108 by re-ordering symbols across the blocks 223 in the sequence of intra-permuted blocks 207 in the manner indicated by arrows 224.

Figure 3:
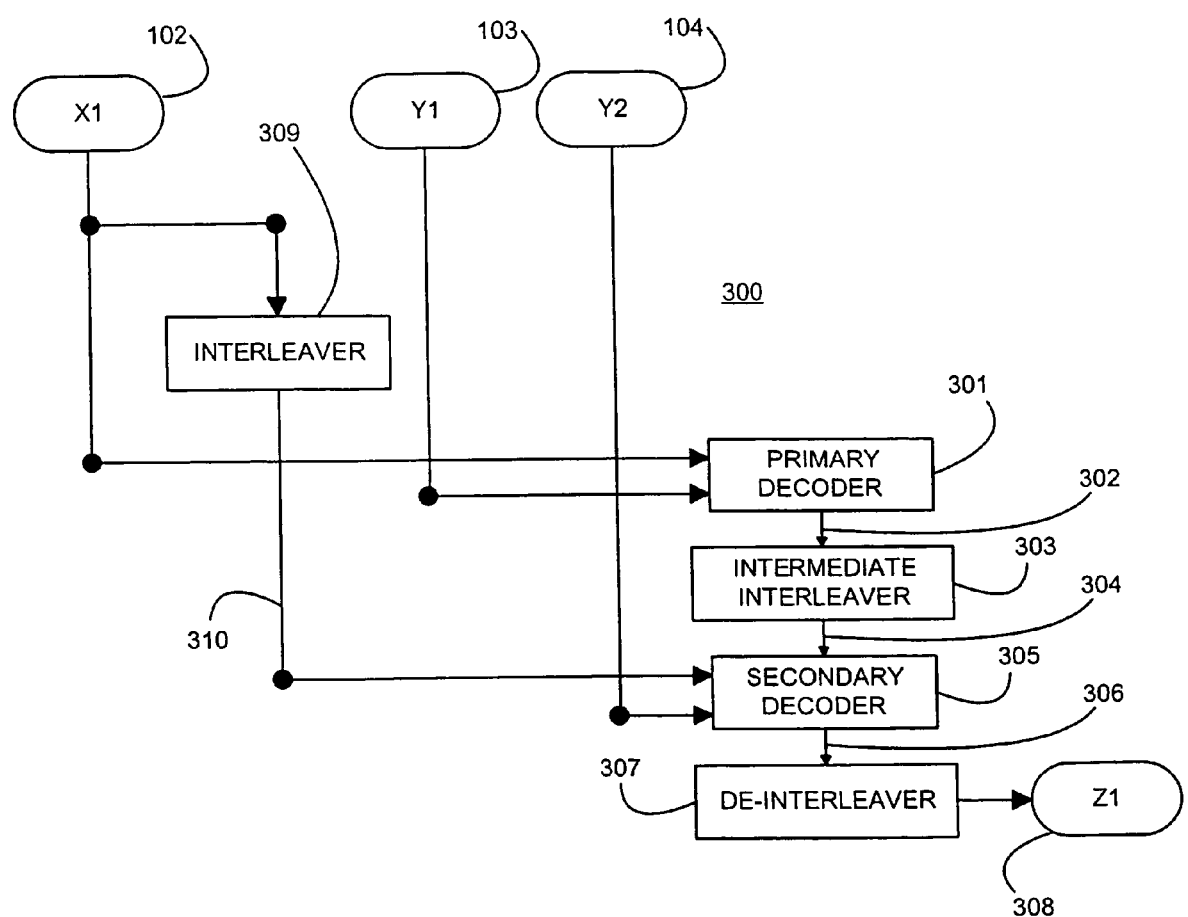
FIG. 3 illustrates an exemplary decoder in which methods, devices, systems, and articles of manufacturer, consistent with features and principles of the present invention may be implemented.

FIG. 3 illustrates an exemplary decoder 300 comprising features and principles consistent with the present invention. Decoder 300 is coupled to receive the formatted copy X1 102 of the source sequence of symbols, the first sequence of codewords Y1 103, and the second sequence of codewords Y2 104 transmitted by the encoder 100 over the medium. Decoder 300 includes a primary decoder 301, a sequence of primary decoded symbols 302, an intermediate interleaver 303, a sequence of intermediate symbols 304, a secondary decoder 305, a sequence of secondary decoded symbols 306, a de-interleaver 307, a sequence of estimated symbols Z1 308, an interleaver 309, and a sequence of interleaved symbols 310.

The interleaver 309 permutes the formatted copy X1 102 of the source sequence of symbols into the sequence of interleaved symbols 310 in the same manner that the interleaver 107 permutes the source sequence of symbols X 101 into the sequence of interleaved symbols 108. The primary decoder 301 decodes the first sequence of codewords Y1 103 to correct any errors found in the formatted copy X1 102 of the source sequence of symbols. The corrected result from the primary decoder 301 is the sequence of primary decoded symbols 302. The intermediate interleaver 303 permutes the sequence of primary decoded symbols 302 into the sequence of intermediate symbols 304 in the same manner that the interleaver 107 permutes the source sequence of symbols X 101 into the sequence of interleaved symbols 108. The secondary decoder 305 decodes the second sequence of codewords Y2 104 and uses the sequence of intermediate symbols 304 to correct any errors in the sequence of interleaved symbols 310. Once the secondary decoder 305 begins receiving the sequence of intermediate symbols 304, the secondary decoder 305 is decoding in parallel with the primary decoder 301. The result from the secondary decoder 305 is the sequence of secondary decoded symbols 306. The de-interleaver 307 permutes the sequence of secondary decoded symbols 306 into the sequence of estimated symbols Z1 308. The permutations performed by the de-interleaver 307 reverse the permutations performed by the interleaver 309.

As a person of ordinary skill in the art will now appreciate, the particular decoding algorithm to be applied by the primary decoder 301 and the secondary decoder 305 is determined by the encoding algorithm used in the primary encoder 105 and secondary encoder 106. As explained above, a variety of different algorithms compatible with the present invention may be used. Exemplary decoding algorithms for use in the present invention may include a Viterbi algorithm as described by Carson, cited above, on pages 501-503, maximum-likelihood algorithms, feedback algorithms, sequential decoding algorithms, one-way maximum a posteriori algorithms, or any other algorithms known in the art and compatible with the present invention.

Figure 4:
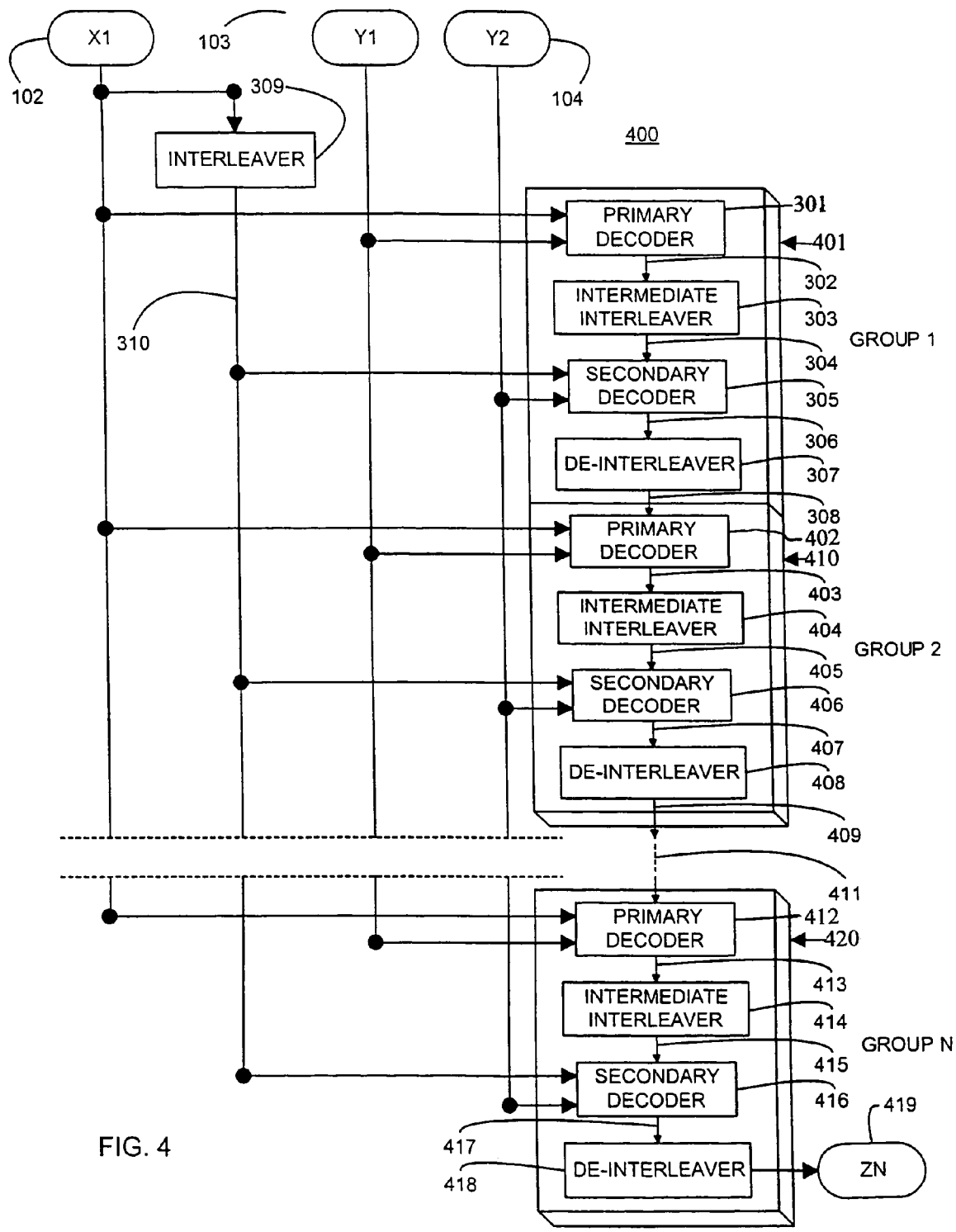
FIG. 4 illustrates an exemplary parallel decoder in which methods, devices, systems, and articles of manufacturer, consistent with features and principles of the present invention may be implemented.

FIG. 4 illustrates an exemplary parallel decoder 400 consistent with features and principles of the present invention. The parallel decoder 400 incorporates the elements 301-310 of the exemplary decoder 300 in FIG. 3. In FIG. 4, the portions 301-308 are grouped into a first decoder group 401. The parallel decoder 400 includes a second decoder group 410 comprising a second primary decoder 402, a second sequence of primary decoded symbols 403, a second intermediate interleaver 404, a second sequence of intermediate symbols 405, a second secondary decoder 406, a second sequence of secondary decoded symbols 407, a second de-interleaver 408, and a second sequence of estimated symbols 409. Furthermore, there are a plurality of N decoder groups 411, wherein each decoder group comprises a primary decoder, a sequence of primary decoded symbols, an intermediate interleaver, a sequence of intermediate symbols, a secondary decoder, a sequence of secondary decoded symbols, a de-interleaver, and a sequence of estimated symbols. An $N^{th}$ decoder group 420 comprises an $N^{th}$ primary decoder 412, an $N^{th}$ sequence of primary decoded symbols 413, an $N^{th}$ intermediate interleaver 414, an $N^{th}$ sequence of intermediates symbols 415, an $N^{th}$ secondary decoder 416, an $N^{th}$ sequence of secondary decoded symbols 417, an $N^{th}$ de-interleaver 418, and an $N^{th}$ sequence of estimated symbols 419.

All the exemplary decoder groups 401, 410, 411, and 420 in FIG. 4 operate in the same manner as described above for the first decoder group 401, which corresponds to blocks 301-308 in FIG. 3. However, in the parallel decoder 400 the sequence of estimated symbols from the de-interleaver in each group is used by the next decoder group as a priori information to perform its function. For example, the sequence of estimated symbols 308 from the first decoder group 401 is used by the primary decoder 402 in the second decoder group 410 to decode the first sequence of codewords Y1 103 and correct any errors found in the formatted copy X1 102 of the source sequence of symbols. After further processing by the intermediate interleaver 404, secondary decoder 406, and de-interleaver 408 operating in the same manner consistent with the first decoder group 401, the resulting second sequence of estimated symbols 409 is used by the next decoder group. This use of the sequence of estimated symbols by each successive decoder group 411 continues to the last decoder group 420. The last decoder group 420 outputs a final sequence of estimated symbols ZN 419.

Figure 5A:
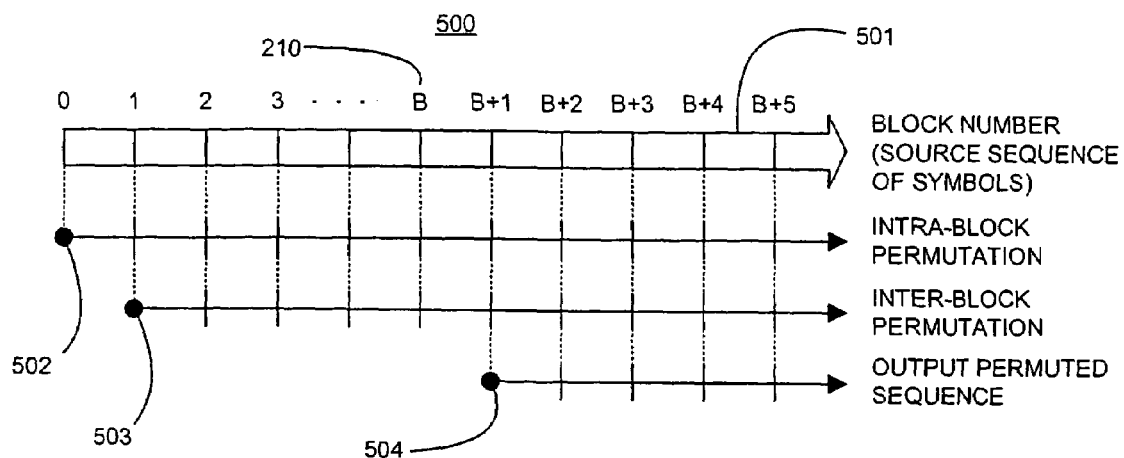
FIG. 5A illustrates a timing diagram for the exemplary interleaver consistent with features and principles of the present invention.
Figure 5B:
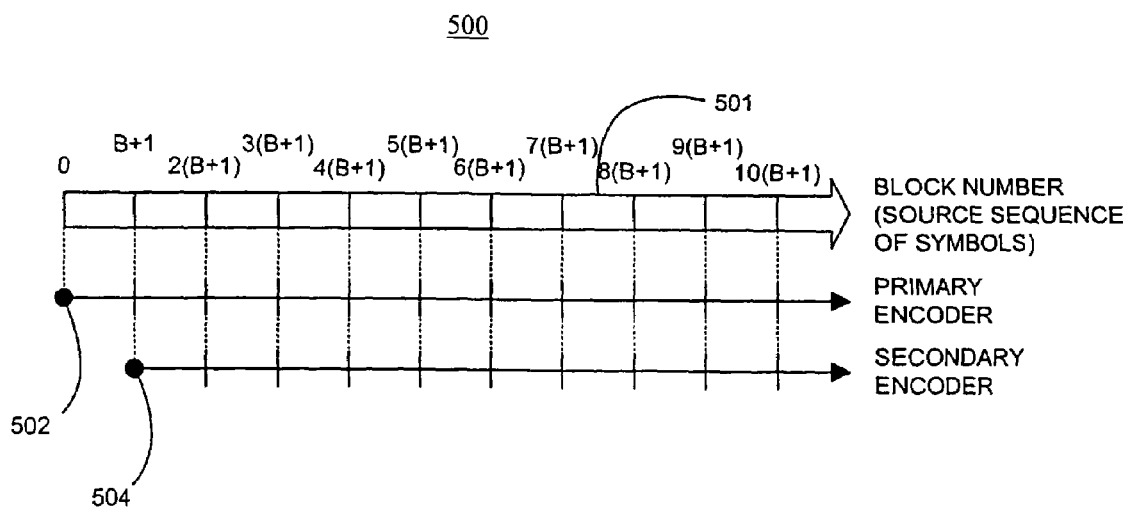
FIG. 5B illustrates a timing diagram for the exemplary encoder consistent with features and principles of the present invention.

FIGS. 5A and 5B illustrate timing diagrams 500 for operations of the exemplary primary encoder 105, secondary encoder 106, and interleaver 107. As previously described, the interleaver 107 groups the source sequence of symbols X 101 into the sequence of blocks 205. With reference also to FIGS. 2A-2C, a timing line 501 is segmented into equal units of data, wherein a block of length L 209 symbols in the source sequence X 101 is one unit. The blocks in the timing line 501 are labeled block 0, block 1, block 2, and so forth. For example, intra-block permutation begins immediately at a start of block 0 502 once the source sequence of symbols X 101 is available. After one full block of the sequence of blocks 205 is intra-permuted by the intra-permuter 202, the second blocker 203 begins at a start of block 1 503 to group the sequence of intra-permuted symbols 206 into the sequence of intra-permuted blocks 207. The inter-permuter 204 begins at the start of block 1 503 to interleave the sequence of intra-permuted blocks 207 across the number of blocks B 210. The interleaver 107 begins outputting at a start of block B+1 504 the sequence of interleaved symbols 108 after B blocks 210 have been inter-permuted. For example, if the number of blocks B 210 is three, then B+1 is equal to four. The primary encoder 105 begins encoding immediately at the start of block 0 502 once the source sequence of symbols X 101 is available. The secondary encoder 106 begins encoding at the start of block B+1 504 once the sequence of interleaved symbols 108 becomes available.

Figure 6:
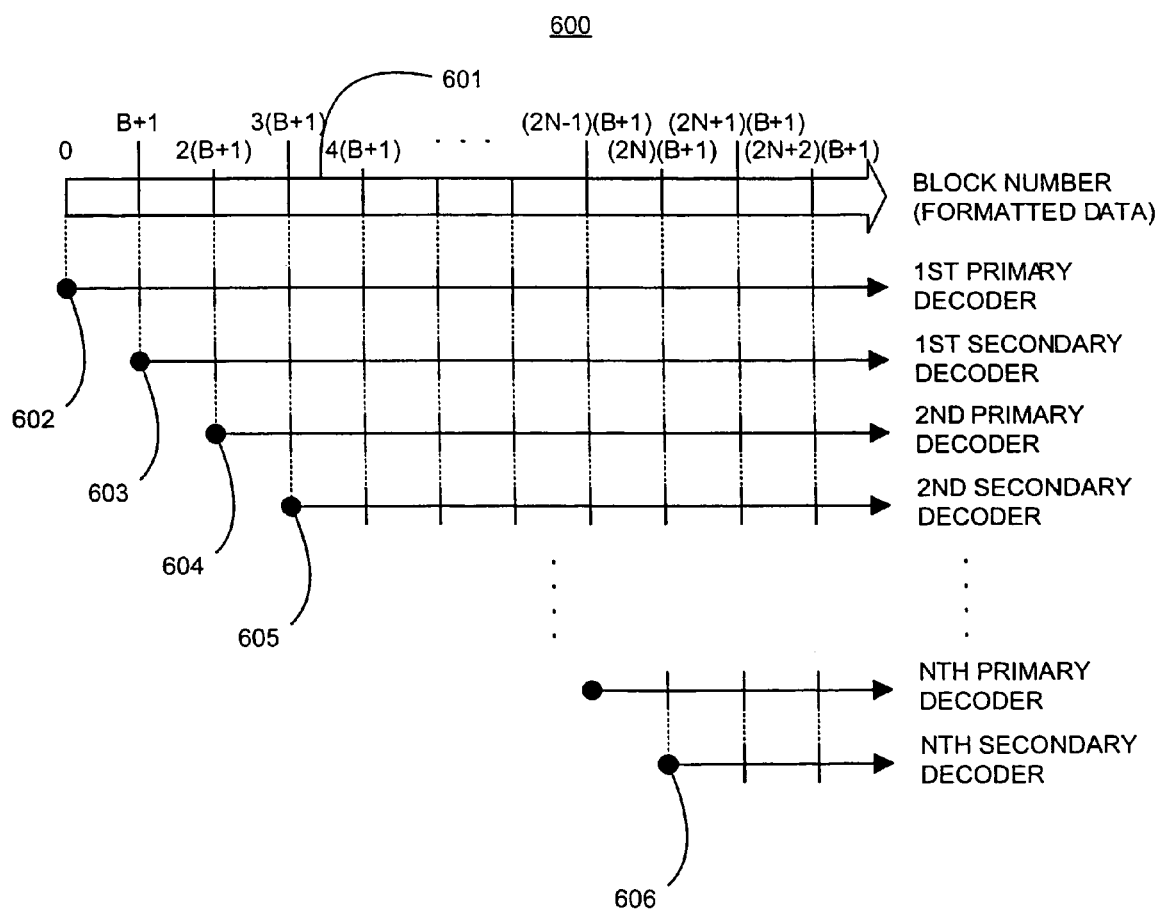
FIG. 6 illustrates a timing diagram for the exemplary parallel decoder consistent with features and principles of the present invention.

FIG. 6 illustrates a timing diagram 600 for the exemplary parallel decoder 400 consistent with features and principles of the present invention. With reference also to FIGS. 2C and 3, a timing line 601 is segmented into equal units of data, wherein a block of length L symbols in the formatted copy X1 102 of the source sequence of symbols is one unit. The blocks in the timing line 601 are labeled block 0, block 1, block 2, and so forth. With reference also to FIGS. 3 and 4, the primary decoder 301 in the first decoder group 401 immediately begins decoding at a start of block 0 602 once formatted copy X1 of the source sequence of symbols and the first sequence of codewords Y1 103 are available. Since the secondary decoder 305 in the first decoder group 401 needs to wait for the intermediate interleaver 303 to output the sequence of intermediate symbols 304, the secondary decoder 305 begins decoding at a start of block B+1 603. The primary decoder 402 in the second decoder group 410 begins decoding at a start of block 2(B+1) 604 because it needs to wait for the first sequence of secondary decoded symbols 306 from the secondary decoder 305 in the first group 401 to be de-interleaved by the de-interleaver 307. For example, if the number of blocks B 210 to inter-permute across is three, then 2(B+1) is equal to eight. The secondary decoder 406 in the second group 410 begins decoding at a start of block 3(B+1) 605 after the second sequence of primary decoded symbols 403 from the primary decoder 402 in the second decoder group 410 is interleaved by the intermediate interleaver 404 in the second decoder group 410. This process continues through subsequent decoder groups 411. The $N^{th}$ secondary decoder 416 begins decoding at a start of block (2N)(B+1) 606. Various embodiments consistent with features and principles of the present invention are described in the foregoing description. However the embodiments are exemplary in nature and do not preclude the present invention from being applied in alternative embodiments. For example, the intra- and inter-permutations performed by interleaver 107 and illustrated in FIGS. 2B and 2C may be performed in other manners consistent with the principles of the invention. Further, although the intra- and inter-permutations follow a prescribed method for re-ordering symbols, the prescribed method may combine one or more of the first block 201, the intra-permuter 202, the second blocker 203, and the inter-permuter functions 204.

Figure 7:
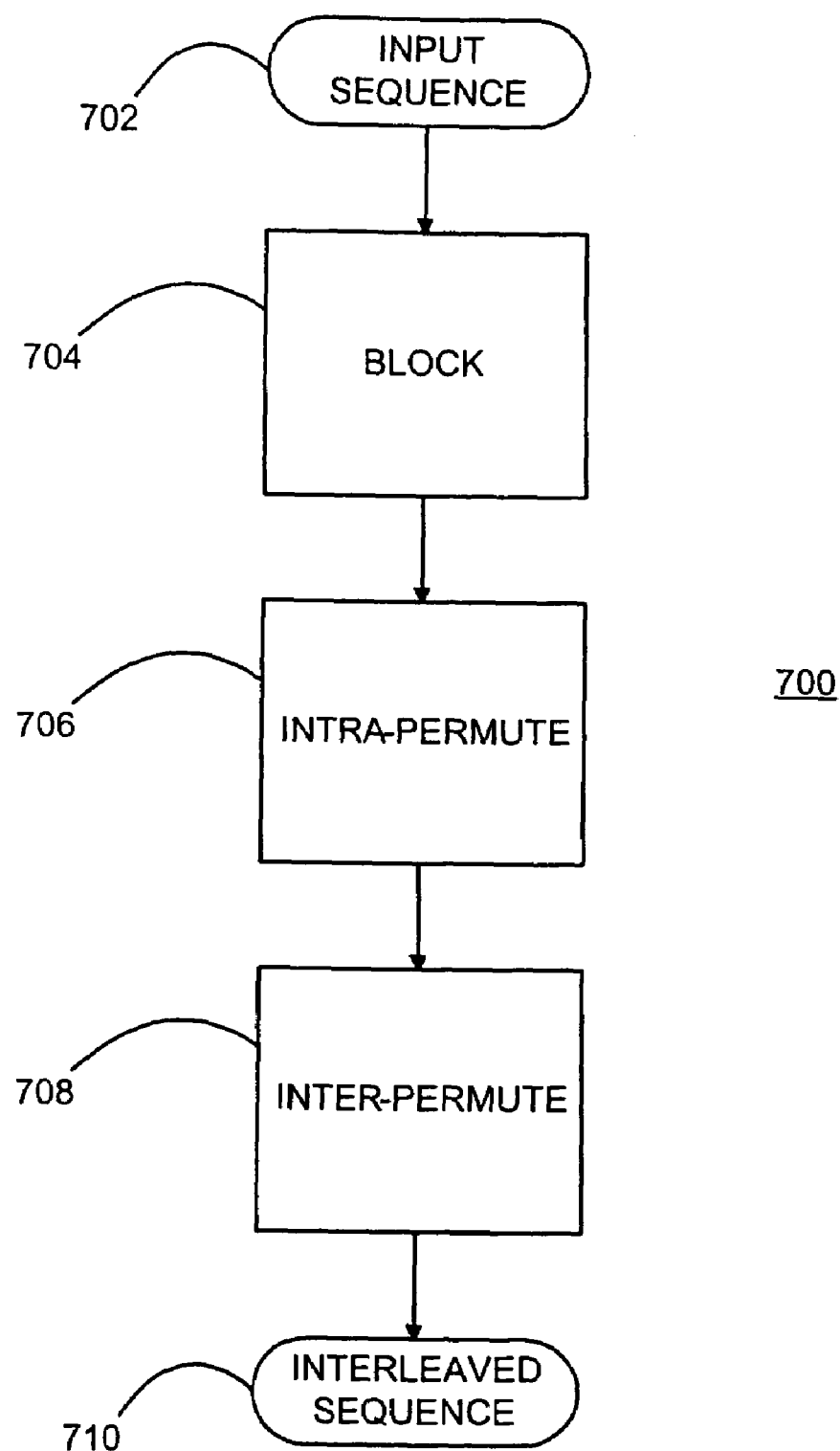
FIG. 7 illustrates another exemplary construction of an interleaver consistent with features and principles of the present invention.

By way of example, another embodiment of the invention involves an interleaver construction 700 with three processes as illustrated in FIG. 7. An entire input sequence of symbols 702 is segmented into M blocks of symbols in a first process 704. Lengths of the blocks maybe the same or different. For this example, each block is assumed to be the same length of R(2D+1) symbols, where R is a positive integer. The blocks are sequentially enumerated from 1 to M blocks. A $K^{th}$ block sub-Week is one of the M blocks, where K is between 1 and M, inclusive.

Second and third processes 706 & 708 perform intra-block and inter-block permutations on the blocks, respectively. The intra-block permutation 706 may be based on any known method, such as s-random or prime interleavers as known by persons of ordinary skill in the art. The inter-block permutation process 708 swaps symbols in a block with those of Nh neighboring blocks, where Nh is less than or equal to 2D blocks and 2D is the permutation spread of the inter-block permutation in blocks.

After the third process 708, a sequence of interleaved symbols is formed at step 710, in which the symbols in a $K^{th}$ block are spread over EK blocks prior to the $K^{th}$ block and LK blocks after the $K^{th}$ block. EK is the lesser of D and (K−1), which is denoted as min(D, K−1). LK is the lesser of D and (M−K), which is denoted as min(D, M−K).

Figure 8:
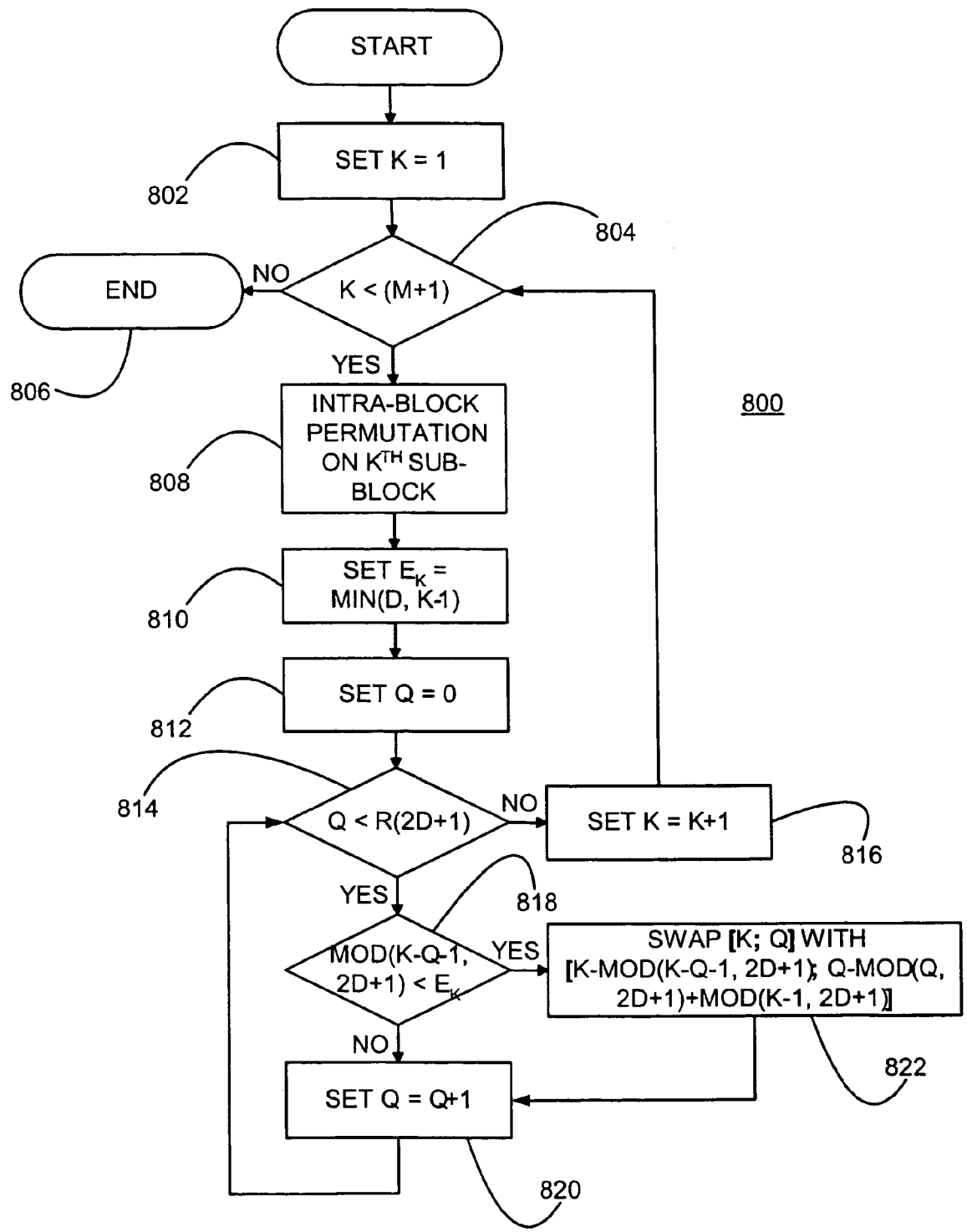
FIG. 8 illustrates a flowchart for an exemplary interleaver algorithm.

Consistent with features and principles of the present invention, an overall interleaving algorithm may be illustrated by a flowchart 800 in FIG. 8. At a start of the algorithm, K is set to one at step 802. From step 802, if K is not less than (M+1) at step 804, then the algorithm stops at step 806. If K is less than (M+1), then intra-block permutation is we performed on the $K^{th}$ block at step 808. EK and Q are set to min(D, K−1) and zero at steps 810 and 812, respectively. From step 812, if Q is not less than R(2D+1) at step 814, then K is incremented at step 816 and the algorithm returns to step 804. If Q is less than R(2D+1), then the algorithm returns to step 818. At step 818, if (K−Q−1) modulo (2D+1), denoted as mod(K−Q−1 ,2D+1), is not less than $E_k$, then Q is incremented at step 820 and the algorithm returns to step 814. If mod((K−Q−1), (2D+1)) is less than $E_k$, then the $Q^{th}$ symbol in the $K^{th}$ intra-permuted block sub-bleek, denoted as [K; Q], is swapped with the $(Q-mod(Q, 2D+1)+mod(K-1, 2D+1))^{th}$ symbol in the $(K-mod(K-Q-1, 2D+1))^{th}$ intra-permuted block, denoted as [Q−mod(Q, 2D+1)mod(K−1, 2D+1); K−mod(K−Q−1, 2D+1)], at step 822. After swapping at step 822, the algorithm increments Q at step 820 and returns to step 814.

Figure 9:
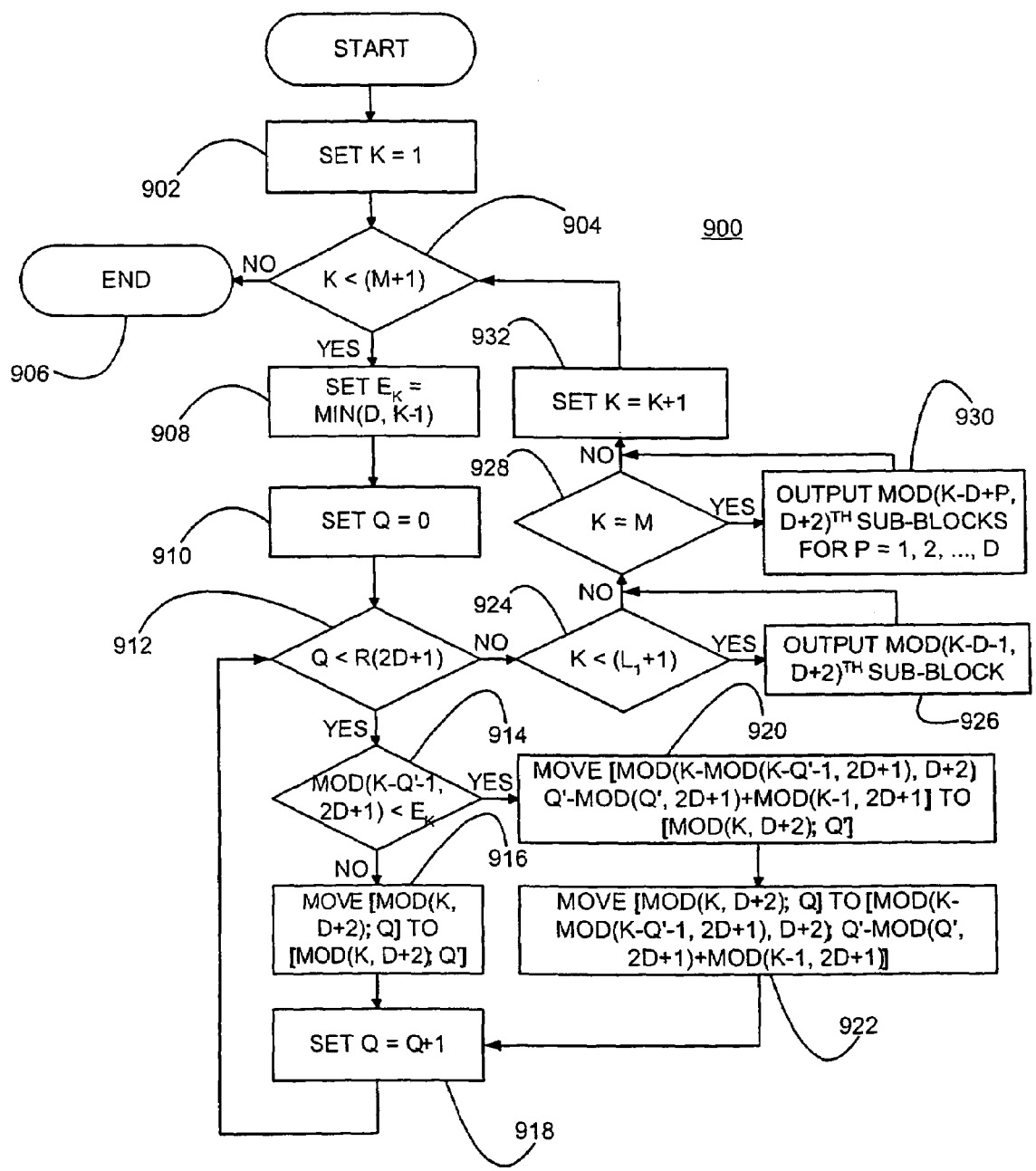
FIG. 9 illustrates a flowchart for an exemplary interleaver and de-interleaver algorithm.

Both the intra-block and inter-block permutations in FIG. 7 may be detemiinistic. Thus, once rules for both permutations are detemiined, the intra-block and inteitlock permutations may be combined into a single step. In another embodiment, a resulting interleaving algorithm combining the peimutations into a single step is illustrated as flowchart 900 in FIG. 9. At a start of the algorithm, K is set to one at step 902. From step 902, if K is not less than (M+1) at step 904, then the algorithm stops at step 906. If K is less than (M+1), then EK and Q are set to min(D, K+1) and zero at steps 908 and 910, respectively. Following step 910, if Q is less than R(2D+1) at step 912, then the algorithm progresses to step 914. At step 914, $Q^1$ is the intra-block permuted position of Q. If mod(K−Q'+1, 2D+1) is not less than Ek, then the symbol at [mod(K, D+2); Q] is moved to [mod(k, D+2); $Q^1$] at step 916, Q is incremented at step 918, and the algorithm retums to step 912. If mod(K−Q'−1, 2D+1) is less than $E_K$ at step 914, then the symbol at [mod(K−mod(K−Q'−1, 2D+1), D+2); Q'−mod(Q', 2D+1)+mod (K−1, 2D+1)] is moved to [mod(K, D+2); $Q^1$] at step 920, the symbol at [mod(K, D+2); Q] is moved to [mod (K−mod(K−Q'−1, 2D+1), D+2); Q'−mod(Q', 2D+1)+mod(K−1, 2D+1)] at step 922, and the algorithm returns to step 918. At step 912, if Q not is less than R(2D+1), then the algorithm progresses to step 924. At step 924, if K is less than (Li+1), then a $mod(K-D-1, D+2)^{th}$ block of interleaved symbols is outputted at step 926 and the algorithm progresses to step 928. If K is not less than (Li+1), then the algorithm progresses directly to step 928. At step 928, ifKis equal to M, then remaining $mod(K-D+p, D+2)^{th}$ blocks of interleaved symbols for P=1,2, . . . , D are outputted at step 930 and the algorithm progresses to step 932. Jf K is not equal to M, then the algorithm progresses directly to step 932. At step 932, K is incremented and the algorithm progresses to step 904.

The algorithm illustrated by flowchart 900 may also be used for de-interleaving. When de-interleaving, Q' at steps 920 and 922 is selected such that the algorithm reverses the intra-block permutation of an interleaver.

In the foregoing description, various features are grouped together in different embodiments for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Description of Embodiments, with each claim standing on its own as a separate embodiment of the invention.

What is claimed is:

1. A decoder that operates on data represented in a sequence of received symbols, wherein the sequence of received symbols comprises a source sequence of symbols and a first and a second sequence of codewords, comprising:

primary decoding means for decoding the first sequence of codewords in combination with the source sequence of symbols to produce a sequence of primary decoded symbols;

interleaving means for performing intra-block and inter-block permutations on, respectively, the source sequence of symbols and the sequence of primary decoded symbols to produce, respectively, a sequence of interleaved symbols and a sequence of intermediate symbols;

secondary decoding means for decoding the second sequence of codewords in combination with the sequence of interleaved symbols and the sequence of intermediate symbols to produce a sequence of secondary decoded symbols; and de-interleaving means for performing inter-block and intra-block permutations on the sequence of secondary decoded symbols to produce a sequence of estimated symbols, said decoder not including means for providing the sequence of deinterleaved secondary decoded symbols to the primary decoder means.

2. The decoder of claim 1, the interleaving means including:

means for grouping the respective sequences of source symbols and primary decoded symbols into a number of blocks in sequence;

means for permuting the symbols within each block of the respective sequences of source symbols and primary decoded symbols into respective sequences of intra-permuted symbols;

means for grouping the respective sequences of intra-permuted symbols into respective sequences of intra-permuted blocks; and means for permuting the symbols of each block of the respective sequences of intra-permuted blocks across a predetermined number of the intra-permuted blocks to form the respective sequences of interleaved symbols and intermediate symbols, the predetermined number being fewer than the number of blocks of the respective sequences of source symbols and primary decoded symbols.

3. The decoder of claim 1, wherein the de-interleaving means operates on the sequence of secondary decoded symbols to reverse the intra-block and inter-block permutations performed by the interleaving means.

4. The decoder of claim 3, wherein the secondary decoding means operates in parallel with the primary decoding means and begins decoding after the primary decoding means decodes a predetermined number of codewords in the first sequence of codewords.

5. The decoder of claim 4, wherein a medium provides the sequence of received symbols.

6. The decoder of claim 5, wherein the medium is one of a communications channel, ambient space, and a storage device.

7. The decoder of claim 4, wherein the primary decoding means and the secondary decoding means employ a decoding algorithm to produce the sequence of primary decoded symbols and the sequence of secondary decoded symbols, respectively.

8. The decoder of claim 7, wherein the decoding algorithm uses a symbol reliability equation.

9. The decoder of claim 1, wherein all primary and secondary decoding means operate in parallel.

10. The decoder of claim 9, wherein all primary decoding means start decoding after respective pre-determined numbers of codewords are decoded in the second sequence of codewords and all secondary decoding means start decoding after respective pre-determined numbers of codewords are decoded in the first sequence of codewords.

11. A method for decoding data represented in a sequence of received symbols, wherein the sequence of received symbols comprises a source sequence of symbols and a first and a second sequence of codewords to be decoded, comprising the steps of:
(a) decoding the first sequence of codewords in combination with the source sequence of symbols to produce a sequence of primary decoded symbols;
(b) interleaving respectively the source sequence of symbols and the sequence of primary decoded symbols using intra-block and inter-block permutations to produce respectively a sequence of interleaved symbols and a sequence of intermediate symbols;
(c) decoding the second sequence of codewords in combination with the sequence of interleaved symbols and the sequence of intermediate symbols to produce a sequence of secondary decoded symbols; and
(d) de-interleaving the sequence of secondary decoded symbols using inter-block and intra-block permutations to produce a sequence of estimated symbols, said sequence of de-interleaved secondary decoded symbols not being included with the decoding of the first sequence of codewords and the source sequence of symbols of step (a).

12. The method of claim 11, wherein the interleaving comprises:
grouping the respective sequences of source symbols and primary decoded symbols into a number of blocks in sequence;
permuting the symbols within each block of the respective sequences of source symbols and primary decoded symbols into respective sequences of intra-permuted symbols;
grouping the respective sequences of intra-permuted symbols into respective sequences of intra-pennuted blocks; and
permuting the symbols of each block of the respective sequences of intra-permuted blocks across a predetermined number of the intra-permuted blocks to form the respective sequences of interleaved symbols and intermediate symbols, the predetermined number being fewer than the number of blocks of the respective sequences of source symbols and primary decoded symbols.

13. The method of claim 11, wherein the de-interleaving reverses the intra-block and inter-block permutations performed by the interleaving on a de-interleaver sequence of input symbols to produce a de-interleaver sequence of output symbols.

14. The method of claim 13, further comprising obtaining the sequence of received symbols from a medium.

15. The method of claim 14, further includes providing the medium as one of a communications channel, ambient space, and a storage device.

16. The method of claim 11, wherein the decoding of the first sequence of code words and the decoding of the second sequence of codewords employ a decoder algorithm to produce the sequence of primary decoded symbols and the sequence of secondary decoded symbols, respectively.

* * * * *

UNITED STATES PATENT AND TRADEMARK OFFICE
CERTIFICATE OF CORRECTION

PATENT NO. : 7,434,115 B2  Page 1 of 1
APPLICATION NO. : 10/960046
DATED : October 7, 2008
INVENTOR(S) : Zheng et al.

It is certified that error appears in the above-identified patent and that said Letters Patent is hereby corrected as shown below:

On the Title Page, please add the following priority data

Item
(62) Divisional of 10/066,658, filed Feb. 6, 2002

Item
(60) Claims Provisional 60/314,673, filed Aug. 27, 2001

Signed and Sealed this

Sixth Day of January, 2009

JON W. DUDAS
*Director of the United States Patent and Trademark Office*